United States Patent
Nam et al.

(10) Patent No.: US 11,650,097 B2
(45) Date of Patent: May 16, 2023

(54) COLOR FILTER ARRAY HAVING COLOR FILTERS, AND IMAGE SENSOR AND DISPLAY DEVICE INCLUDING THE COLOR FILTER ARRAY

(71) Applicant: SAMSUNG ELECTRONICS CO., LTD., Suwon-si (KR)

(72) Inventors: Sunghyun Nam, Yongin-si (KR); Sookyoung Roh, Seoul (KR); Seokho Yun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 104 days.

(21) Appl. No.: 16/990,747

(22) Filed: Aug. 11, 2020

(65) Prior Publication Data

US 2020/0373343 A1  Nov. 26, 2020
US 2023/0069822 A9  Mar. 2, 2023

Related U.S. Application Data

(63) Continuation of application No. 15/456,076, filed on Mar. 10, 2017, now Pat. No. 10,739,188.

(30) Foreign Application Priority Data

Mar. 10, 2016 (KP) .................. 10-2016-0029095

(51) Int. Cl.
*G01J 1/04* (2006.01)
*G02B 1/00* (2006.01)
(Continued)

(52) U.S. Cl.
CPC .............. *G01J 1/0488* (2013.01); *G01J 1/44* (2013.01); *G02B 1/002* (2013.01); *G02B 5/201* (2013.01);
(Continued)

(58) Field of Classification Search
CPC ......... G01J 1/0488; G01J 1/44; G02B 1/002; G02B 5/201; G02B 5/206; G02B 5/207;
(Continued)

(56) References Cited

U.S. PATENT DOCUMENTS 4,548,473 A    10/1985  Lo et al.
7,121,669 B2   10/2006  Iisaka
(Continued)

FOREIGN PATENT DOCUMENTS

CN    1573466 A    2/2005
CN    1769956 A    5/2006
(Continued)

OTHER PUBLICATIONS

Hyungsung Park et al; "Multispectral imaging with vertical silicon nanowires"; Scientific Reports; Aug. 19, 2013; pp. 1-6.
(Continued)

*Primary Examiner* — Seung C Sohn
(74) *Attorney, Agent, or Firm* — Sughrue Mion, PLLC

(57) ABSTRACT

A color filter array may include a plurality of color filters arranged two-dimensionally and configured to allow light of different wavelengths to pass therethrough. Each of the plurality of color filters includes at least one Mie resonance particle and a transparent dielectric surrounding the at least one Mie resonance particle.

19 Claims, 16 Drawing Sheets

(51) Int. Cl.
*H01L 27/146* (2006.01)
*H01L 31/02* (2006.01)
*G02B 5/20* (2006.01)
*H01L 31/0216* (2014.01)
*G01J 1/44* (2006.01)

(52) U.S. Cl.
CPC ............. *G02B 5/206* (2013.01); *G02B 5/207* (2013.01); *H01L 27/14603* (2013.01); *H01L 27/14621* (2013.01); *H01L 27/14625* (2013.01); *H01L 27/14685* (2013.01); *H01L 31/02162* (2013.01)

(58) Field of Classification Search
CPC ......... H01L 27/14603; H01L 27/14621; H01L 27/14625; H01L 27/14685; H01L 31/02162
See application file for complete search history.

(56) References Cited

U.S. PATENT DOCUMENTS

| | | | |
|---|---|---|---|
| 7,554,716 B2 | 6/2009 | Kita et al. | |
| 7,580,105 B2 * | 8/2009 | Shyu .................. | G02F 1/13394 349/155 |
| 7,701,024 B2 | 4/2010 | Kasano et al. | |
| 8,330,904 B2 | 12/2012 | Yoon | |
| 8,937,361 B2 | 1/2015 | Oganesian et al. | |
| 9,000,353 B2 | 4/2015 | Seo et al. | |
| 9,525,006 B2 | 12/2016 | Nam et al. | |
| 9,985,063 B2 | 5/2018 | Oganesian et al. | |
| 2005/0139945 A1 | 6/2005 | Lim | |
| 2009/0091644 A1 | 4/2009 | Mackey | |
| 2009/0103095 A1 * | 4/2009 | Beausoleil ............. | B82Y 20/00 356/402 |
| 2010/0149396 A1 | 6/2010 | Summa et al. | |
| 2011/0032398 A1 | 2/2011 | Lenchenkov | |
| 2011/0242376 A1 | 10/2011 | Ando | |
| 2012/0020608 A1 | 1/2012 | Gibson et al. | |
| 2012/0129269 A1 | 5/2012 | Choi | |
| 2013/0293751 A1 | 11/2013 | Vaartstra | |
| 2015/0171244 A1 | 6/2015 | Seo et al. | |
| 2015/0214261 A1 | 7/2015 | Park et al. | |
| 2015/0214268 A1 | 7/2015 | Kim | |
| 2015/0221710 A1 | 8/2015 | Motoyama | |
| 2015/0311248 A1 * | 10/2015 | Lee .................. | H01L 27/14698 257/432 |
| 2016/0065814 A1 | 3/2016 | Kim et al. | |
| 2016/0203775 A1 | 7/2016 | Chui et al. | |
| 2019/0041260 A1 | 2/2019 | Zhang | |

FOREIGN PATENT DOCUMENTS

| | | |
|---|---|---|
| CN | 1963652 A | 5/2007 |
| CN | 102103224 A | 6/2011 |
| CN | 105047679 A | 11/2015 |
| KR | 10-2012-0089548 A | 8/2012 |
| KR | 10-2015-0143147 A | 12/2015 |

OTHER PUBLICATIONS

Communication issued by the European Patent Office dated Aug. 7, 2017 in counterpart European Patent Application No. 17160402.8.
Communication dated Oct. 10, 2022 by the Chinese Patent Office for Chinese Patent Application No. 201710144236.6.
Communication dated Dec. 7, 2022 issued by the Korean Patent Office in counterpart Korean Patent Application No. 10-2016-0029095.

* cited by examiner

COLOR FILTER ARRAY HAVING COLOR FILTERS, AND IMAGE SENSOR AND DISPLAY DEVICE INCLUDING THE COLOR FILTER ARRAY

CROSS-REFERENCE TO RELATED APPLICATION

This application is a continuation of U.S. application Ser. No. 15/456,076 filed Mar. 10, 2017, now U.S. Pat. No. 10,739,188, which claims the priority from Korean Patent Application No. 10-2016-0029095, filed on Mar. 10, 2016, in the Korean Intellectual Property Office, the disclosure of which is incorporated herein in its entirety by reference.

BACKGROUND

1. Field

Apparatuses consistent with exemplary embodiments relate to a color filter array, an image sensor including the color filter array, and a display device including the color filter array, and, more particularly, to a color filter array including inorganic color filters, an image sensor including the color filter array, and a display device including the color filter array.

2. Description of the Related Art

A color image sensor typically includes organic color filters to detect colors of light incident thereon. A color display device may use organic color filters to display images of various colors. Typically, organic color filters are manufactured by forming a black matrix on a glass substrate, forming color filter patterns of a plurality of colors such as red, green, and blue by sequentially using respective dyes or pigments, and planarizing the color filter patterns to level the height of the color filter patterns. The overall process of manufacturing the color filters may be quite complex because the patterning processes are performed sequentially for each color. Furthermore, since the thickness of the organic color filters may be large to guarantee a desired color quality, crosstalk is likely to appear due to light rays obliquely incident on the organic color filters.

SUMMARY

According to an aspect of an exemplary embodiment, a color filter array includes a plurality of color filters and an isolation wall. The plurality of color filters are arranged two-dimensionally and transmit light of different wavelengths. Each of the color filters includes at least one Mie resonance particle and a transparent dielectric surrounding the at least one Mie resonance particle. The isolation wall is disposed between adjacent ones of the plurality of color filters to prevent interactions between Mie resonance particles of the adjacent ones of the plurality of color filters.

A refractive index of the at least one Mie resonance particle may be greater than a refractive index of the transparent dielectric.

The at least one Mie resonance particle may be formed of a material selected from a group consisting of germanium (Ge), amorphous silicon (a-Si), polycrystalline silicon (p-Si), crystalline silicon (c-Si), III-V compound semiconductor, titanium dioxide (TiO2), silicon nitride (SiNx), and a combination thereof.

The at least one Mie resonance particle may have a refractive index greater than 3.5 at a wavelength of visible light.

The transparent dielectric may be formed of siloxane-based spin on glass (SOG), transparent polymer, silicon dioxide (SiO2), or air.

The material forming the isolation wall may be different from the material forming the transparent dielectric.

The isolation wall may be formed of a material selected from a group consisting of tungsten (W), aluminum (Al), gold (Au), silver (Ag), titanium (Ti), nickel (Ni), platinum (Pt), an alloy thereof, titanium nitride (TiN), air, and a combination thereof.

A thickness of each of the plurality of color filters may be in a range from about 200 nm to about 300 nm.

An aspect ratio of each of the at least one Mie resonance particle may be in a range from about 0.5 to about 6.

The plurality of color filters may include a first color filter configured to transmit light of a first wavelength range; and a second color filter configured to transmit light of a second wavelength range different from the first wavelength range. A shape, a size, and a thickness of the at least one Mie resonance particle of the first color filter and a distance between the Mie resonance particles of the first color filter may be chosen such that the light of the first wavelength range is transmitted. Also, a shape, a size, and a thickness of the at least one Mie resonance particle of the second color filter and a distance between the Mie resonance particles of the second color filter may be chosen such that the light of the second wavelength range is transmitted.

Each of the plurality of color filters may include a plurality of unit cells each of which comprises a plurality of Mie resonance particles. The plurality of unit cells may be arranged periodically within each of the plurality of color filters. The plurality of Mie resonance particles may be arranged irregularly within each of the plurality of unit cells.

The isolation wall may include a plurality of isolation members arranged along boundaries of each of the plurality of color filters. The plurality of isolation members may be spaced apart from each other.

Each of the plurality of color filters may include four first Mie resonance particles. Each of the first Mie resonance particles may have a quarter circular shape and be disposed at a corner of each of the plurality of color filters.

Each of the plurality of color filters may further include a second Mie resonance particle. The second Mie resonance particle may have a circular shape and be disposed at center portion of each of the plurality of color filters.

Each of the plurality of color filters may include a square shaped Mie resonance particle. The square shaped Mie resonance particle may be disposed at center portion of each of the plurality of color filters.

According to an aspect of another exemplary embodiment, an image sensor includes: a light sensing layer including an array of a plurality of pixels arranged two-dimensionally and configured to detect light of different wavelength ranges; and a color filter array disposed on the light sensing layer and configured to include a plurality of color filters arranged two-dimensionally and configured to transmit the light of different wavelengths. Each of the plurality of color filters includes at least one Mie resonance particle and a transparent dielectric surrounding the at least one Mie resonance particle. The color filter array includes an isolation wall arranged between adjacent ones of the plurality of color filters and configured to prevent interactions between Mie resonance particles of the adjacent ones of the plurality of color filters.

According to another aspect of another exemplary embodiment, an image sensor includes: a first light sensing layer including a first pixel configured to absorb and detect light of a first wavelength range and to transmit light outside of the first wavelength range; a second light sensing layer facing the first light sensing layer and including a second pixel configured to detect light of a second wavelength range and a third pixel configured to detect light of a third wavelength range; and a color filter array disposed between the first light sensing layer and the second light sensing layer and including a second color filter facing the second pixel and configured to transmit the light of the second wavelength range and a third color filter facing the third pixel and configured to transmit the light of the third wavelength range. Each of the second color filter and the third color filter includes at least one Mie resonance particle and a transparent dielectric surrounding the at least one Mie resonance particle. The color filter array includes an isolation wall arranged between the second color filter and the third color filter and configured to prevent interactions between Mie resonance particles of the second color filter and Mie resonance particles of the third color filter.

The image sensor may further include: a plurality of color separation elements disposed between the first light sensing layer and the color filter array and configured to direct the light of the second wavelength range transmitted through the first light sensing layer toward the second pixel and direct the light of the third wavelength range transmitted through the first light sensing layer toward the third pixel.

The image sensor may further include: a plurality of driving signal lines extending from the second light sensing layer to the first light sensing layer and configured to transmit driving signals to the first light sensing layer or receive data signals from the first light sensing layer.

For example, the isolation wall may be formed of a conductive metallic material, and the plurality of driving signal lines may extend to the first light sensing layer through the isolation wall.

According to an aspect of another exemplary embodiment, a display device includes: a pixel array including a plurality of display pixels arranged two-dimensionally and configured to display an image; and a color filter array disposed on the pixel array and including a plurality of color filters arranged two-dimensionally and configured to transmit light of different wavelengths. Each of the plurality of color filters includes at least one Mie resonance particle and a transparent dielectric surrounding the at least one Mie resonance particle. The color filter array includes an isolation wall arranged between adjacent ones of the plurality of color filters and configured to prevent interactions between Mie resonance particles of the adjacent ones of the plurality of color filters.

BRIEF DESCRIPTION OF THE DRAWINGS

These and/or other exemplary aspects and advantages will become apparent and more readily appreciated from the following description of the exemplary embodiments, taken in conjunction with the accompanying drawings in which.

DETAILED DESCRIPTION

Figure 1:
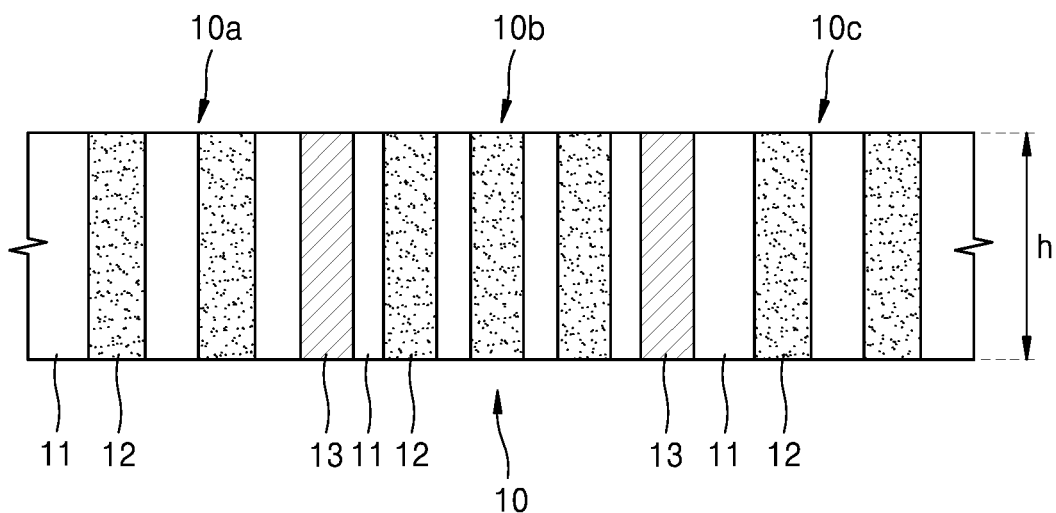
FIG. 1 is a cross-sectional view schematically illustrating a color filter array according to an exemplary embodiment.

Hereinbelow, a color filter array including an inorganic color filter, an image sensor including the color filter array, and a display device including the color filter array will be described in detail with reference to the accompanying drawings. In the drawings, like reference numbers refer to like elements throughout, and the size of each element may be exaggerated for clarity of illustration. Exemplary embodiments described herein are for illustrative purposes only, and various modifications may be made therefrom. In the following description, when an element is referred to as being "above" or "on" another element in a layered structure, it may be directly on, under, or lateral to the other element while making contact with the other element or may be above, below, or lateral to the other element without making contact with the other element.

While the use of a black matrix, as discussed above, is not uncommon in display devices, the role of a black matrix in such devices is to prevent backlight from passing through gaps between pixels. In contrast, in image sensors, a metal grid, such as one of tungsten, may be used. However, since microlenses disposed on top of image sensor color filters may prevent crosstalk between color filters, the use of such a metal grid is optional. A metal grid may provide electrical stability by preventing unwanted charge accumulations at the pixels, but may also cause significant, undesirable degradation of quantum efficiency because, unlike display pixels which are comparatively large, image sensor pixels may be only micron-sized. The use of a metal grid may also reduce infrared sensitivity and thus provide a slight decrease in spectral crosstalk. Accordingly, the role of the isolation walls described herein may be different from that of a metal grid, in that the isolation walls may reduce near field interactions between neighboring Mie resonators at pixel boundaries and also minimize lateral flow of light propagation due to scattering from the Mie resonators.

FIG. 1 is a cross-sectional view schematically illustrating a color filter array 10 according to an exemplary embodiment. Referring to FIG. 1, the color filter array 10 according to an exemplary embodiment may include a plurality of color filters 10A, 10B, and 10C arranged in a two-dimensional array, to transmit light of different wavelengths, and an isolation wall 13 arranged between the color filters 10A and 10B, and between the color filters 10B and 10C. Each of the color filters 10A, 10B, and 10C may include a plurality of Mie resonance particles 12 and transparent dielectrics 11 sandwiching the plurality of Mie resonance particles 12.

The Mie resonance particles 12 may be disposed in each of the color filters 10A, 10B, and 10C in various manners. In general, 'Mie resonance' or 'Mie scattering' refers to a scattering phenomenon that happens at a particle having a size dimension comparable to the wavelength of incident light. According to the 'Mie resonance' or 'Mie scattering', an optical resonance occurs in a certain wavelength range determined by conditions of the particle, and the light in the certain wavelength range is strongly scattered by the particle. In the present exemplary embodiment, color characteristics of each of the color filters 10A, 10B, and 10C is determined by the shapes, sizes, and thickness of the Mie resonance particles and distances between the Mie resonance particles in the respective color filters 10A, 10B, and 10C.

For example, the shapes, sizes, and thicknesses of the Mie resonance particles 12 and the distances between the Mie resonance particles 12 in the first color filter 10A may be configured such that the first color filter 10A may transmit light of a first wavelength range. Accordingly, of the light incident on the first color filter 10A, only the light of the first wavelength range may be transmitted through the first color filter 10A and the light of a second and third wavelength ranges may be reflected or absorbed by the first color filter 10A, because of resonance scatterings of individual Mie resonance particles 12 and resonances and diffractions due to interactions of adjacent Mie resonance particles 12.

Also, the shapes, sizes, and thicknesses of the Mie resonance particles 12 and the distances between the Mie resonance particles in the second color filter 10B may be configured such that the second color filter 10B may transmit light of the second wavelength range different from the first wavelength range. Accordingly, of the light incident on the second color filter 10B, only the light of the second wavelength range may be transmitted through the second color filter 10B and the light of the first and third wavelength ranges may be reflected or absorbed by the second color filter 10B because of the resonance scatterings of individual Mie resonance particles 12 and the resonances and the diffractions due to the interactions of adjacent Mie resonance particles 12.

Similarly, the shapes, sizes, and thicknesses of the Mie resonance particles 12 and the distances between the Mie resonance particles in the third color filter 10C may be configured such that the third color filter 10C may transmit light of the third wavelength range different from the first and second wavelength ranges. Accordingly, of the light incident on the third color filter 10C, only the light of the third wavelength range may be transmitted through the third color filter 10C and the light of the first and second wavelength ranges may be reflected or absorbed by the third color filter 10C because of the resonance scatterings of individual Mie resonance particles 12 and the resonances and the diffractions due to the interactions of adjacent Mie resonance particles 12.

The Mie resonance particles 12 may be disposed in the transparent dielectric 11 in any of various manners. A refractive index of the Mie resonance particles 12 may be greater than that of a surrounding material to ensure a high resonance efficiency. Thus, the refractive index of the Mie resonance particles 12 may be greater than that of the transparent dielectric 11. For example, the transparent dielectric 11 may be formed of siloxane-based spin on glass (SOG), transparent polymer, silicon dioxide (SiO2), or air, and the Mie resonance particles 12 may be formed of a material having a high refractive index such as germanium (Ge), amorphous silicon (a-Si), polycrystalline silicon (p-Si), crystalline silicon (c-Si), III-V compound semiconductor, titanium dioxide (TiO2), and silicon nitride (SiNx). In particular, the Mie resonance particles 12 formed of a material with a refractive index greater than 3.5 in a visible light wavelength range may be used to enhance the resonance efficiency.

A diameter or a length of one side of each Mie resonance particle 12 may range from about 40 nanometers (nm) to about 500 nm to facilitate the Mie resonance. The Mie resonance particles 12 may have various shapes such as a sphere, an ellipsoid, and a polyhedron, for example, but the shapes of the Mie resonance particles 12 are not limited thereto. The thickness of the Mie resonance particles 12 may range from about 50 nm to about 300 nm, and the aspect ratio may range from about 0.5 to about 6.

The isolation wall 13 prevents interactions of the Mie resonance particles 12 in two or more adjacent color filters 10A, 10B, and 10C. Without the isolation wall 13, the Mie resonance particles 12 in the color filter 10A, 10B, or 10C may interact with the Mie resonance particles 12 in an adjacent color filter and thereby affect the resonance characteristics of respective color filters 10A, 10B, and 10C. As a result, light having a wavelength outside the wavelength range set for each of the color filters 10A, 10B, and 10C may be scattered. The isolation wall 13 may be formed of a material different from that of the transparent dielectric 11 so as to isolate the Mie resonance particles 12 in the adjacent color filters 10A, 10B, and 10C. For example, the isolation wall 13 may be formed of: a metallic material such as tungsten (W), aluminum (Al), gold (Au), silver (Ag), titanium (Ti), nickel (Ni), platinum (Pt), and an alloy thereof; a dielectric material such as titanium nitride (TiN); or the air. In case that the transparent dielectric 11 is air, the isolation wall 13 may be formed of any of the above material other than the air. Since the interaction of the Mie resonance particles 12 across the isolation wall 13 is minimized owing to the isolation wall 13, each of the color filters 10A, 10B, and 10C may maintain the desired transmission characteristics.

Figure 2:
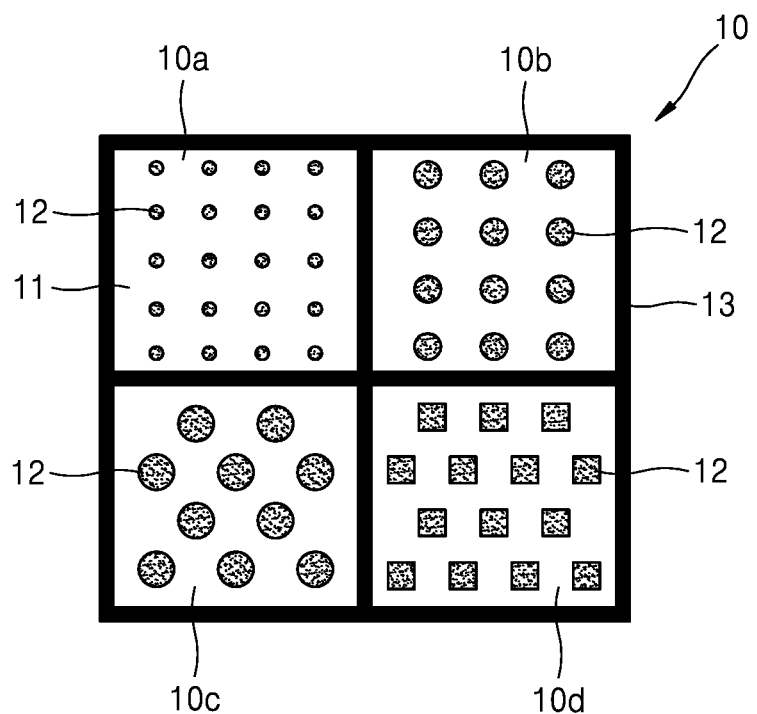
FIG. 2 is a plan view schematically illustrating a color filter array according to an exemplary embodiment.

FIG. 2 is a plan view schematically illustrating the color filter array 10 according to an exemplary embodiment. Although it is shown in FIG. 1, for exemplary purposes, that three color filters 10A, 10B, and 10C are arranged in series, the number and arrangement of the color filters 10A, 10B, and 10C are not limited thereto but may be altered as needed. For example, it is shown in the planar view of FIG. 2 that four color filters 10A-10D, placed in a rectangular arrangement, constitute a unit pattern. However, the arrangement shown in FIG. 2 is also provided only for exemplary purposes.

Referring to FIG. 2, the isolation wall 13 may form a grating structure that completely encloses each of the color filters 10A-10D. In each of the color filters 10A-10D, a plurality of Mie resonance particles 12 may be arranged regularly at a certain period. The arrangement period, sizes, and shapes of the Mie resonance particles 12 in any one of the color filters 10A-10D may be different from those of the Mie resonance particles 12 in any other color filter, so that the light transmission characteristics of the four the color filters 10A-10D may be different from one another. It is shown in FIG. 2 that the Mie resonance particles 12 disposed in each of the first through third color filters 10A-10C have the same shapes but have different arrangement periods and sizes in the each of the color filters, and the Mie resonance particles 12 disposed in the fourth color filter 10D have an arrangement period, size, and shape different from the particles in the first through third color filters 10A-10C. However, the arrangement periods, sizes, and shapes of the Mie resonance particles 12 are not limited to the example shown in FIG. 2. Furthermore, the Mie resonance particles 12 in one color filter 10A, 10B, 10C, or 10D may have sizes and shapes different from one another. In other words, the Mie resonance particles 12 having various sizes and shapes may exist even in each of the color filters 10A-10D.

Figure 3:
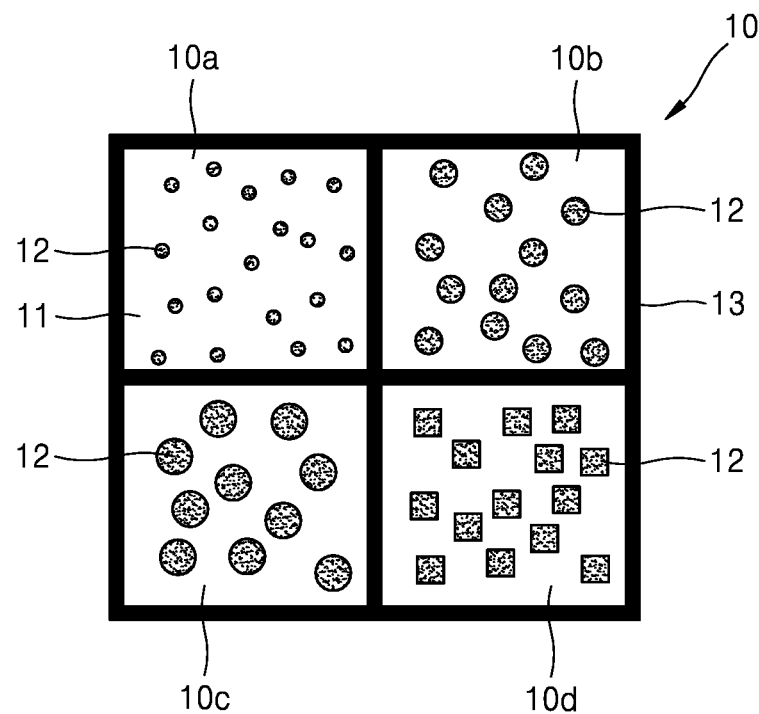
FIG. 3 is a plan view schematically illustrating a color filter array according to another exemplary embodiment.

FIG. 3 is a plan view schematically illustrating the color filter array 10 according to another exemplary embodiment. Although it is shown in FIG. 2 that the Mie resonance particles 12 are disposed periodically, the arrangement of the Mie resonance particles 12 is not limited thereto. As shown in FIG. 3, for example, the Mie resonance particles 12 may be disposed irregularly within each of the color filters 10A-10D. That is, the shapes, sizes, and arrangement pattern of the Mie resonance particles 12 may be chosen freely to meet the color characteristics set for each of the color filters 10A-10D. For example, the shapes, sizes, and arrangement patterns of the Mie resonance particles 12 for each of the color filters 10A-10D may be determined using a computer simulation, so that each of the color filters 10A-10D may have respectively desired color characteristics.

Although it is shown in FIGS. 2 and 3 that the four color filters 10A-10D disposed in a rectangular shape have color characteristics which are different from one another, the color characteristics of the color filters is not limited thereto. For example, in case that the color filter array 10 has a Bayer pattern structure, the color filters 10A-10D may be designed such that the first color filter 10A and the fourth color filter 10D, disposed diagonally, transmit green light, the second color filter 10B transmits red light, and the third color filter 10C transmits blue light. In such a case, the shape, size, and arrangement pattern of the Mie resonance particles 12 in the first color filter 10A may be the same as those of the particles in the fourth color filter 10D.

Figure 4:
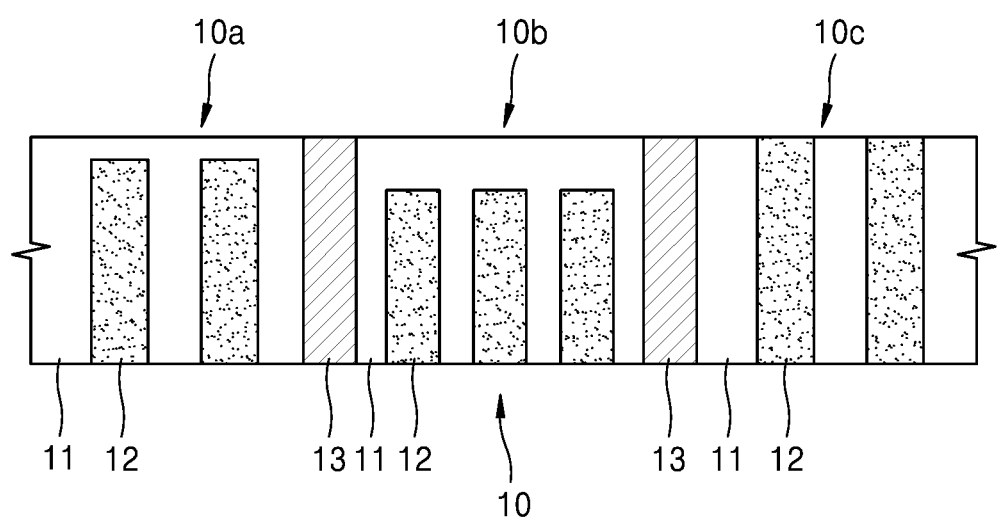
FIG. 4 is a cross-sectional view schematically illustrating a color filter array according to another exemplary embodiment.

FIG. 4 is a cross-sectional view schematically illustrating a color filter array 10 according to another exemplary embodiment. In FIG. 1, all the three color filters 10A, 10B, and 10C and the Mie resonance particles 12 in the three color filters 10A, 10B, and 10C have same thickness 'h'. In order to obtain desired resonance characteristics, however, the thicknesses of the Mie resonance particles 12 may be varied. For example, the thicknesses of the Mie resonance particles 12 in three color filters 10A, 10B, and 10C may be different from one another as shown in FIG. 4. Furthermore, although it is shown in FIG. 4 that the Mie resonance particles 12 disposed in one of the color filters 10A, 10B, and 10C have the same thickness, the Mie resonance particles 12 within a single color filter may have thicknesses different from each other as needed.

Figure 5:
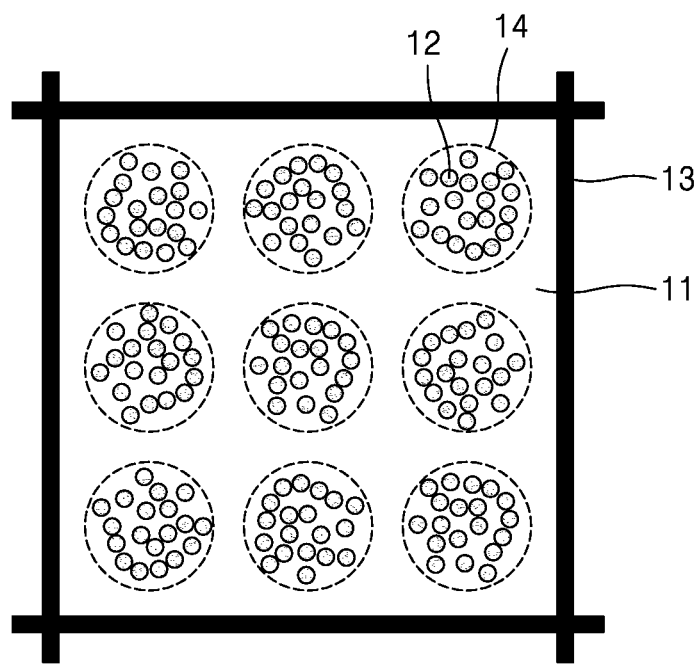
FIG. 5 is a plan view illustrating an exemplary arrangement of Mie resonance particles in a color filter array according to another exemplary embodiment.

FIG. 5 is a plan view illustrating an exemplary arrangement of Mie resonance particles 12 in a color filter array 10 according to another exemplary embodiment. Although only a single color filter is shown in FIG. 5, for convenience of description, the structure shown in FIG. 5 may be applied to any of the color filters 10A-10D. Referring to FIG. 5, each of the color filters 10A-10D may be configured to include a plurality of unit cells 14, each of which includes a plurality of Mie resonance particles 12. The plurality of Mie resonance particles 12 in each of the unit cells 14 may be arranged irregularly. The plurality of unit cells 14 in each of the color filters 10A-10D may be disposed regularly, within the color filter, to have a certain period, but the periods of arranging the unit cells 14 may differ among the color filters 10A-10D. In such a structure, the resonance characteristics of each color filter 10A, 10B, 10C, or 10D may depend on the respective periods of the unit cells 14. Also, even when the arrangement periods of the unit cells 14 are the same in each of the color filters 10A-10D, the resonance characteristics of each color filter 10A, 10B, 10C, or 10D may depend on the shapes, sizes, and arrangement patterns of the Mie resonance particles 12 within the unit cells 14. Accordingly, the color characteristics of the color filters 10A-10D may be precisely determined as needed by selecting a suitable combination of the shapes, sizes, and arrangement patterns of the Mie resonance particles 12, as well as the arrangement periods of the unit cells 14.

Figure 6:
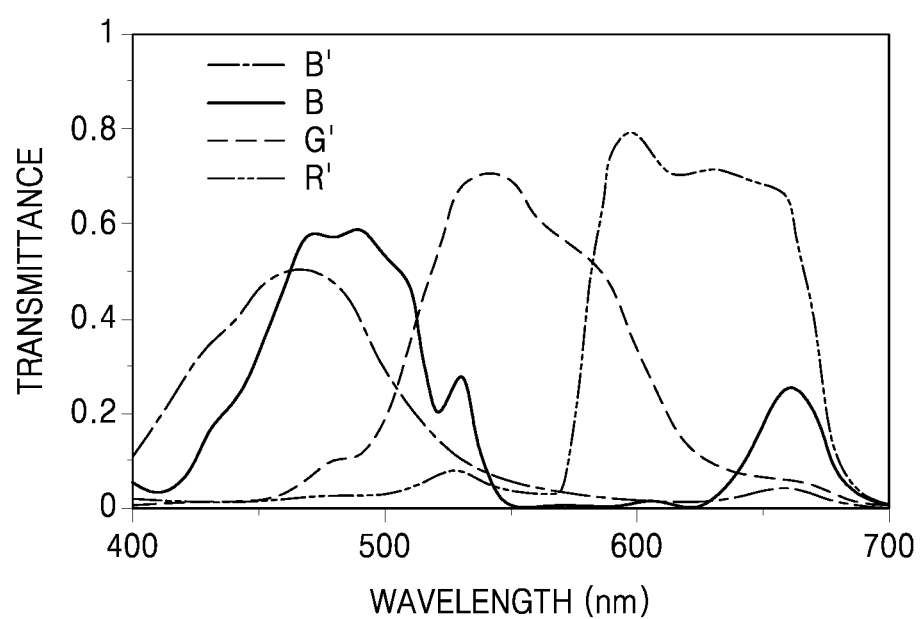
FIGS. 6 through 8 are graphs illustrating exemplary transmittance spectra of each color filter according to arrangements of Mie resonance particles.
Figure 7:
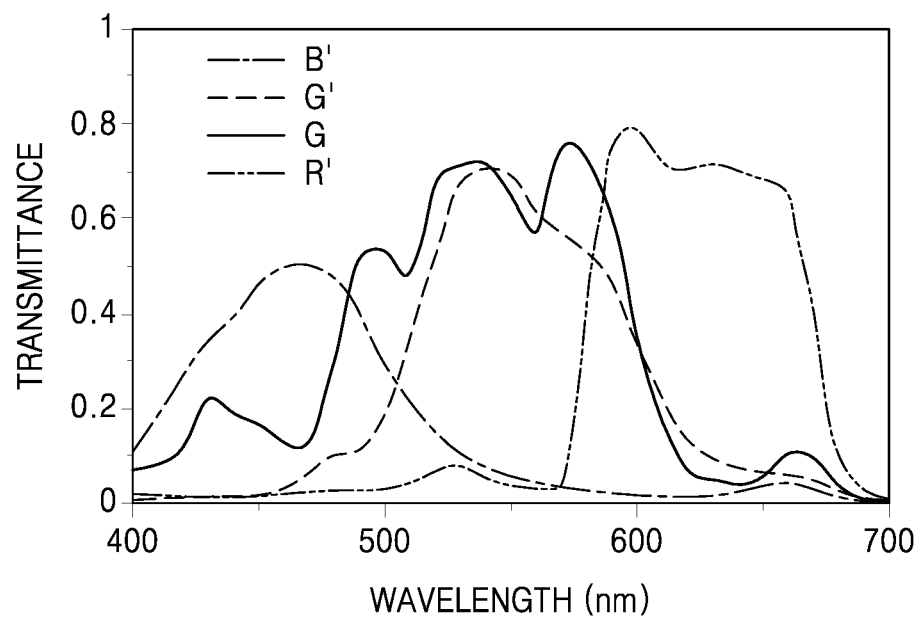
Figure 8:
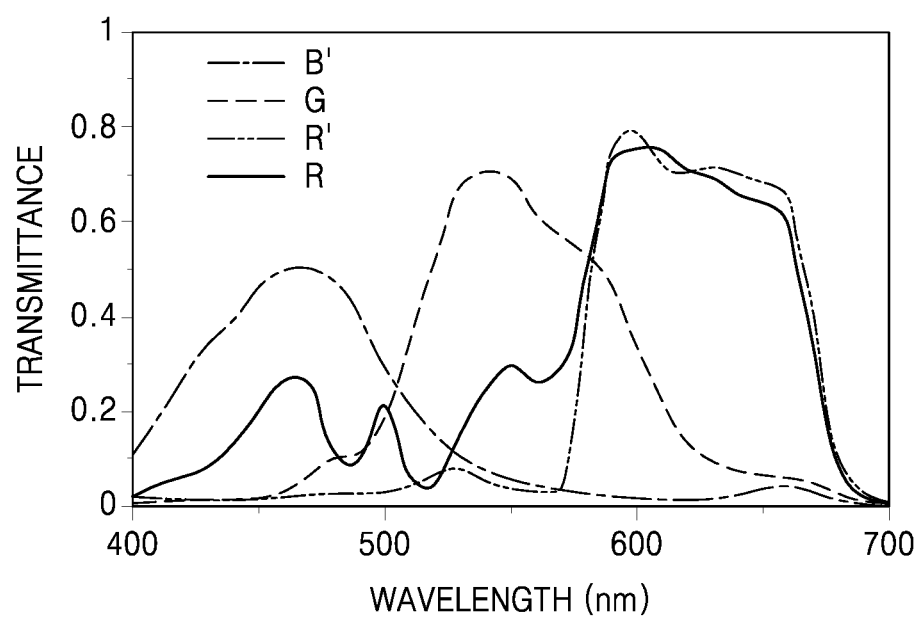

FIGS. 6 through 8 are graphs illustrating exemplary transmittance spectra for each color filter according to arrangements of the Mie resonance particles 12. In the color filters of FIGS. 6 through 8, the Mie resonance particles 12 formed of polysilicon were used, and the thicknesses, arrangement periods, and widths of the Mie resonance particles 12 were differentiated among the color filters corresponding to FIGS. 6 through 8, respectively. In the drawings, the horizontal axis measures the wavelength of incident light and the transmittance is plotted on the vertical axis. For comparison, the transmittance characteristics of related art organic color filters are plotted together as graphs designated by legends B', G', and R'.

First, FIG. 6 illustrates a transmittance spectrum in a case in which the thickness of the Mie resonance particles 12 is 200 nm, the arrangement period is 260 nm, and the width is 130 nm. As shown by a solid line graph designated by a legend B, the color filter transmits most of the blue light while absorbing or reflecting the red light and green light.

FIG. 7 illustrates a transmittance spectrum in the case that the thickness of the Mie resonance particles 12 is 200 nm, the arrangement period is 320 nm, and the width is 170 nm. As shown by a solid line graph designated by a legend G, the color filter transmits most of the green light while absorbing or reflecting the blue light and the red light. FIG. 8 illustrates a transmittance spectrum in the case that the thickness of the Mie resonance particles 12 is 150 nm, the arrangement period is 260 nm, and the width is 220 nm. As shown by a solid line graph designated by a legend R, the color filter transmits most of the red light while absorbing or reflecting the blue light and green light. Consequently, the transmittance spectrum of a color filter may be adjusted precisely by changing the shape, size, period, and arrangement pattern of the Mie resonance particles 12.

Figure 9:
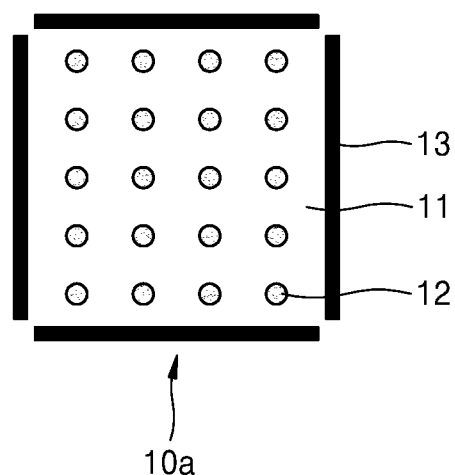
FIGS. 9 and 10 are plan views illustrating exemplary structures of an isolation wall in a color filter array according to another exemplary embodiments.
Figure 10:
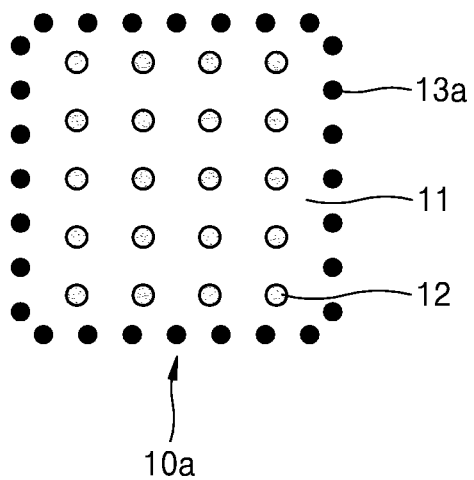

On the other hand, although the isolation wall 13 was described above to form a grating structure which completely encloses each of the color filters 10A-10D, the structure or shape of the isolation wall 13 is not limited thereto. An isolation wall 13 of any shape may be used as long as the isolation wall 13 obstructs interactions between the Mie resonance particles 12 belonging to the adjacent color filters 10A-10D. For example, FIGS. 9 and 10 are plan views illustrating exemplary structures of the isolation wall 13 in the color filter array 19 according to another exemplary embodiment. As shown in FIG. 9, the isolation wall 13 may be cut near the vertices of each color filter 10A, 10B, 10C, or 10D, such that there are gaps in the isolation wall 13 at the corners of each of the color filters. Thus, the isolation wall 13 may be disposed only at the sides of each color filter 10A, 10B, 10C, or 10D, such that the isolation wall 13 is divided discontinuously into a plurality of portions. Also, referring to FIG. 10, the isolation wall 13 may include a plurality of isolation members 13A disposed along boundaries of each of the color filters 10A-10D. The plurality of isolation members 13A may have cross sections in any shape, such as a circle and a polygon, and may be spaced apart from each other by a certain distance. While one isolation wall 13 is disposed at each side of the color filters 10A-10D in the example of FIG. 9, a plurality of isolation members 13A are disposed at each side of the color filters 10A-10D in the example of FIG. 10.

Figure 11:
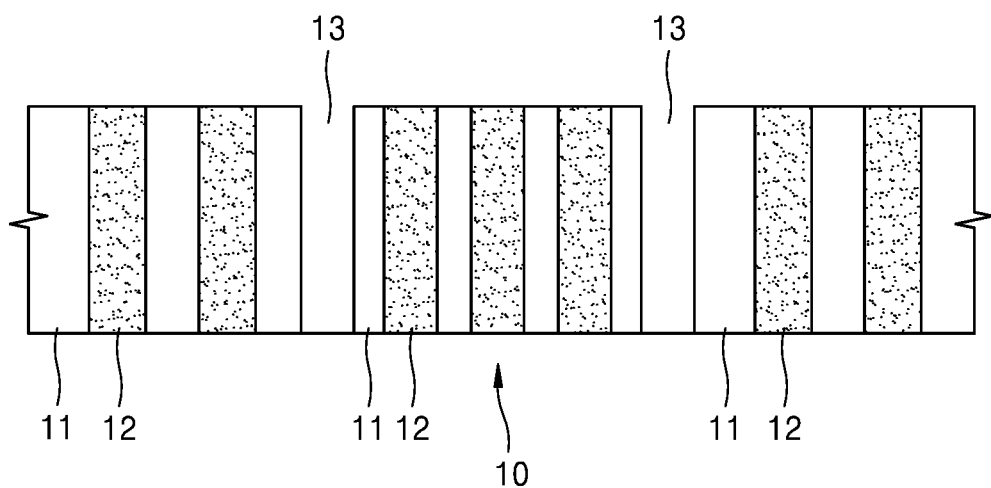
FIG. 11 is a cross-sectional view illustrating an exemplary structure of an isolation wall in a color filter array according to another exemplary embodiment.

FIG. 11 is a cross-sectional view illustrating an exemplary structure of an isolation wall 13 in a color filter array 10 according to another exemplary embodiment. As shown in FIG. 11, air may be used as an isolation material of the isolation wall 13. In this case, two adjacent dielectric layers 11 may be spaced apart by a certain gap, and the gap between the two adjacent dielectric layers 11 may be filled with air, thus forming the isolation wall.

As described above, the color filter array 10 according to the disclosed embodiments are inorganic color filter array that utilizes Mie resonance particles 12. the manufacturing of such a color filter array 10 does not require the use of dyes or pigments, and the colors filters 10A-10D for all colors may be formed simultaneously by using common lithography and patterning techniques. Thus, the manufacturing process of the color filter array 10 according to the disclosed exemplary embodiments may be simplified as compared to the manufacturing process of a related art organic color filter. Also, the thickness of each color filter 10A, 10B, 10C, or 10D in the color filter array 10 may be reduced since the color characteristics of each color filter 10A, 10B, 10C, or 10D may be adjusted easily according to the shape, size, thickness, and arrangement patterns of the Mie resonance particles 12 disposed therein. For example, the thickness of each color filter 10A, 10B, 10C, or 10D in a color filter array 10 according to an exemplary embodiment disclosed herein ranges from about 200 nm to 300 nm. Accordingly, when the color filter array 10 according to an exemplary embodiment disclosed herein is installed in an image sensor or a display device, the crosstalk caused by light incident obliquely may be suppressed.

Figure 12:
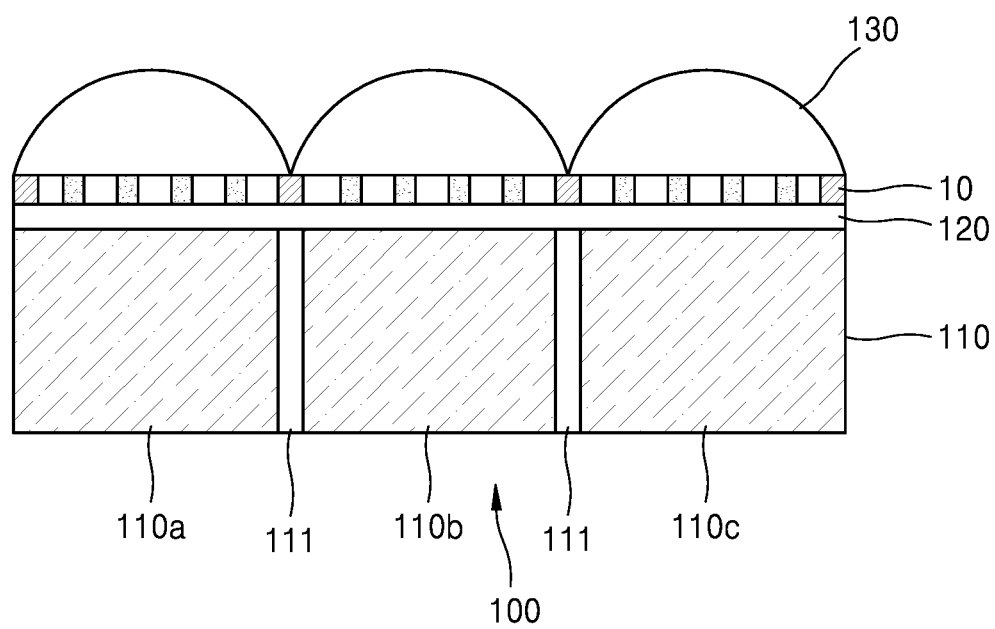
FIG. 12 is a cross-sectional view schematically illustrating an image sensor according to an exemplary embodiment that employs the color filter array according to the above exemplary embodiments.

FIG. 12 is a cross-sectional view schematically illustrating an image sensor 100 according to an exemplary embodiment that employs the color filter array 10 according to the exemplary embodiments discussed above. Referring to FIG. 12, an image sensor 100 may include a light sensing layer 110 configured to convert the intensity of incident light into an electrical signal, the color filter array 10 having a plurality of color filters 10A-10C disposed on the light sensing layer 110, and a plurality of microlenses 130 disposed on the color filter array 10. Also, the image sensor 100 may further include an antireflection layer 120 disposed between the light sensing layer 110 and the color filter array 10, as needed, to prevent the reflection of light incident from the color filter array 10 onto the light sensing layer 110.

The light sensing layer 110 includes a plurality of independent pixels 110A, 110B, and 110C arranged in a two-dimensional array, and the pixels adjacent to each other may be separated by a trench 111. A separate color filter 10A, 10B, or 10C may be provided for each of the pixels 110A-110C. For example, the first color filter 10A transmitting light of the first wavelength range may be disposed on a first pixel 110A, the second color filter 10B transmitting light of the second wavelength range may be disposed on a second pixel 110B, and the third color filter 10C transmitting light of the third wavelength range may be disposed on a third pixel 110C. Accordingly, the first pixel 110A may detect an intensity of the light of the first wavelength range, the second pixel 110B may detect an intensity of the light of the second wavelength range, and the third pixel 110C may detect an intensity of the light of the third wavelength range. The plurality of microlenses 130 are arranged so as to focus the incident light on respectively corresponding pixels 110A-110C.

Although FIG. 12 illustrates a case in which the color filter array 10 is installed in an image sensor 100, the color filter array 10 may be applied similarly to a display device as well. In such a case, the pixels 110A-110C shown in FIG. 12 may be display pixels for displaying images rather than light sensing pixels which detect light incident thereon. The display pixels may be provided in a liquid crystal layer, for example, or in an organic light emitting layer that emits white light. In a case in which the color filter array 10 is applied to a display device, the microlens disposed on the color filter array 10 may be omitted.

Figure 13:
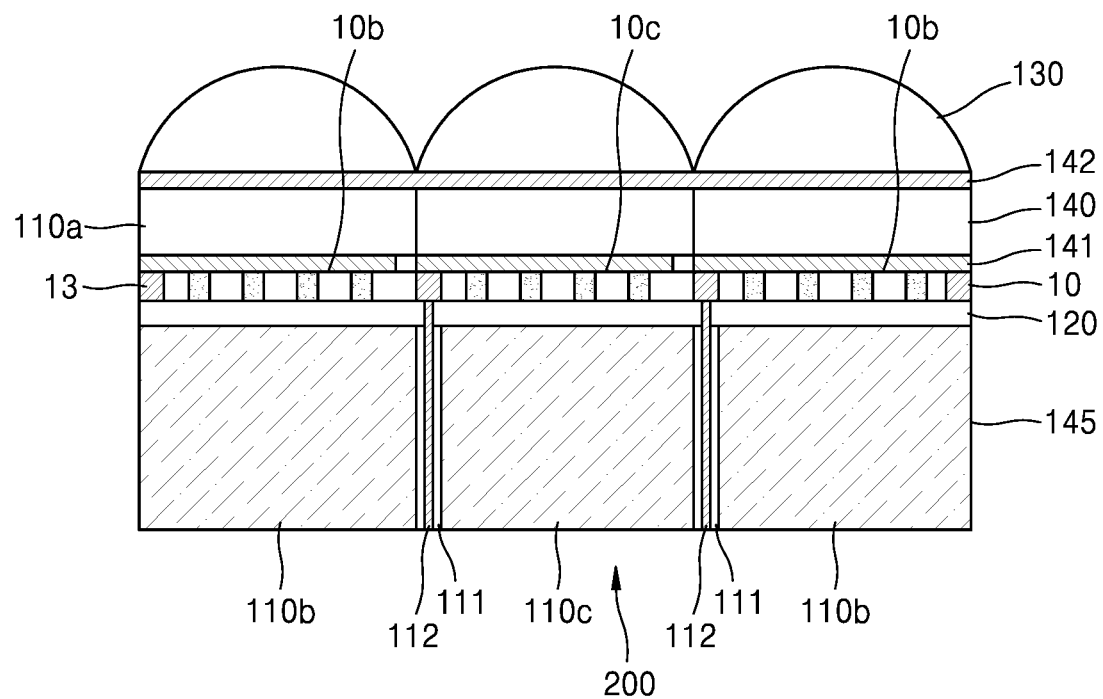
FIG. 13 is a cross-sectional view schematically illustrating an image sensor according to another exemplary embodiment, which includes the color filter array according to the above exemplary embodiments.

FIG. 13 is a cross-sectional view schematically illustrating an image sensor 200 according to another exemplary embodiment that employs the color filter array 10 discussed above. Referring to FIG. 13, the image sensor 200 may include a first light sensing layer 140 including a plurality of first pixels 110A absorbing and detecting light of a first wavelength range and transmitting light of other wavelength ranges, a second light sensing layer 145 including a plurality of second pixels 110B detecting light of a second wavelength range, and a plurality of third pixels 110C detecting light of a third wavelength range, and the color filter array 10 disposed between the first light sensing layer 140 and the second light sensing layer 145. Also, the image sensor 200 may further include an antireflection layer 120 disposed between the second light sensing layer 145 and the color filter array 10 to prevent the reflection of light incident from the color filter array 10 onto the second light sensing layer 145.

The first light sensing layer 140 and the second light sensing layer 145 may be stacked as shown in FIG. 13. More specifically, the color filter array 10 may be disposed on an upper surface of the second light sensing layer 145, and the first light sensing layer 140 may be disposed on an upper surface of the color filter array 10, such that the first light sensing layer 140 is disposed opposite the second light sensing layer 145. In this case, the first light sensing layer 140 and the second light sensing layer 145 may be configured to detect different wavelength ranges of light. Particularly, the first light sensing layer 140 may be configured to absorb only light of a first wavelength range to be detected and may transmit light of second and third wavelength ranges.

For example, the first light sensing layer 140 may absorb only light of a green wavelength range and transmit light of red and blue wavelength ranges. The first light sensing layer 140 having such characteristics may include a material such as a rhodamine-based pigment, a merocyanine-based pigment, or quinacridone. In the present exemplary embodiments, however, the absorption wavelength range of the first light sensing layer 140 is not limited to a green wavelength range. Alternatively, the first light sensing layer 140 may be configured to absorb and detect only light of a red wavelength range and transmit light of blue and green wavelength ranges. Alternatively, the first light sensing layer 140 may absorb and detect only light of a blue wavelength range and transmit light of green and red wavelength ranges. For example, the first light sensing layer 140 may include a phthalocyanine-based pigment to detect light of a red wavelength range, or may include a material such as a coumarin-based pigment, tris-(8-hydroxyquinoline)aluminum ($Alq_3$), or a merocyanine-based pigment to detect light of a blue wavelength range.

As described above, light of a first wavelength range incident on the image sensor 200 is absorbed by the first light sensing layer 140, and only light of second and third wavelength ranges may be transmitted through the first light sensing layer 140. Light of second and third wavelength ranges that is transmitted through the first light sensing layer 140 may be incident on the color filter array 10. The color filter array 10 may include the second color filter 10B disposed on the second pixel 110B and configured to transmit only light of a second wavelength range, and the third color filter 10C disposed on the third pixel 110C and configured to transmit only light of a third wavelength range. Accordingly, of light of the second and third wavelength ranges that is transmitted through the first light sensing layer 140, light of the second wavelength range may be transmitted through the second color filter 10B and be incident on the second pixel 110B in the second light sensing layer 145. Also, of the light transmitted through the first light sensing layer 140, light of a third wavelength range may be transmitted through the third color filter 10C and be incident on the third pixel 110C in the second light sensing layer 145.

In addition, the image sensor 200 may further include a first transparent electrode 141 and a second transparent electrode 142 respectively disposed on a lower surface and an upper surface of the first light sensing layer 140, a plurality of microlenses 130 disposed on top of the second transparent electrode 142, and driving signal lines 112 suitable for transmitting driving signals to the first light sensing layer 140 or receiving data signals from the first light sensing layer 140. For example, the first transparent electrode 141 may be a pixel electrode providing a driving signal, independently, to each of the first pixels 110A in the first light sensing layer 140. In this case, a plurality of first transparent electrodes 141 may be disposed separately for respectively corresponding first pixels 110A. The second transparent electrode 142 may be a common electrode shared by all the first pixels 110A in the first light sensing layer 140. The first and second transparent electrodes 141 and 142 may be formed of, for example, a transparent conductive oxide such as indium tin oxide (ITO), indium zinc oxide (IZO), aluminum zinc oxide (AZO), and gallium zinc oxide (GZO).

A driving circuit (not shown in the cross-sectional view of FIG. 13) may be disposed under the second light sensing layer 145 to control operations of the first light sensing layer 140 and the second light sensing layer 145 and to process data received from the first light sensing layer 140 and the second light sensing layer 145. The driving signal lines 112 connect the driving circuit disposed under the second light sensing layer 145 to the first light sensing layer 140. For example, the driving signal lines 112 may be disposed along the trench 111 between the second pixel 110B and the third pixel 110C. Also, the driving signal lines 112 may penetrate the antireflection layer 120 to be connected to the isolation wall 13 of the color filter array 10. In this case, the isolation wall 13 may be formed of conductive metal so as to be electrically connected to the first transparent electrode 141. Meanwhile, the isolation wall 13 may have a discontinuous structure as shown in FIG. 9 or FIG. 10 so that the isolation wall 13 is electrically connected to only one of the first transparent electrodes 141 corresponding thereto. Accordingly, the driving signal lines 112 may extend to the first light sensing layer 140 through the isolation wall 13 in the color filter array 10.

According to the image sensor 200 of the present exemplary embodiments, the number of pixels per unit area may be increased since the first light sensing layer 140 and the second light sensing layer 145 are arranged in a stacked manner. Therefore, the resolution of the image sensor 200 may be enhanced. Furthermore, the loss of light may be reduced since the first light sensing layer 140 absorbs and detects most of the light of a first wavelength range and transmits most of the light of second and third wavelength ranges and the second light sensing layer 145 detects light of the second and third wavelength ranges transmitted through the first light sensing layer 140. Therefore, most of the light of the first through third wavelength ranges may be used efficiently, and the sensitivity of the image sensor 200 may be improved in all wavelength ranges.

Figure 14:
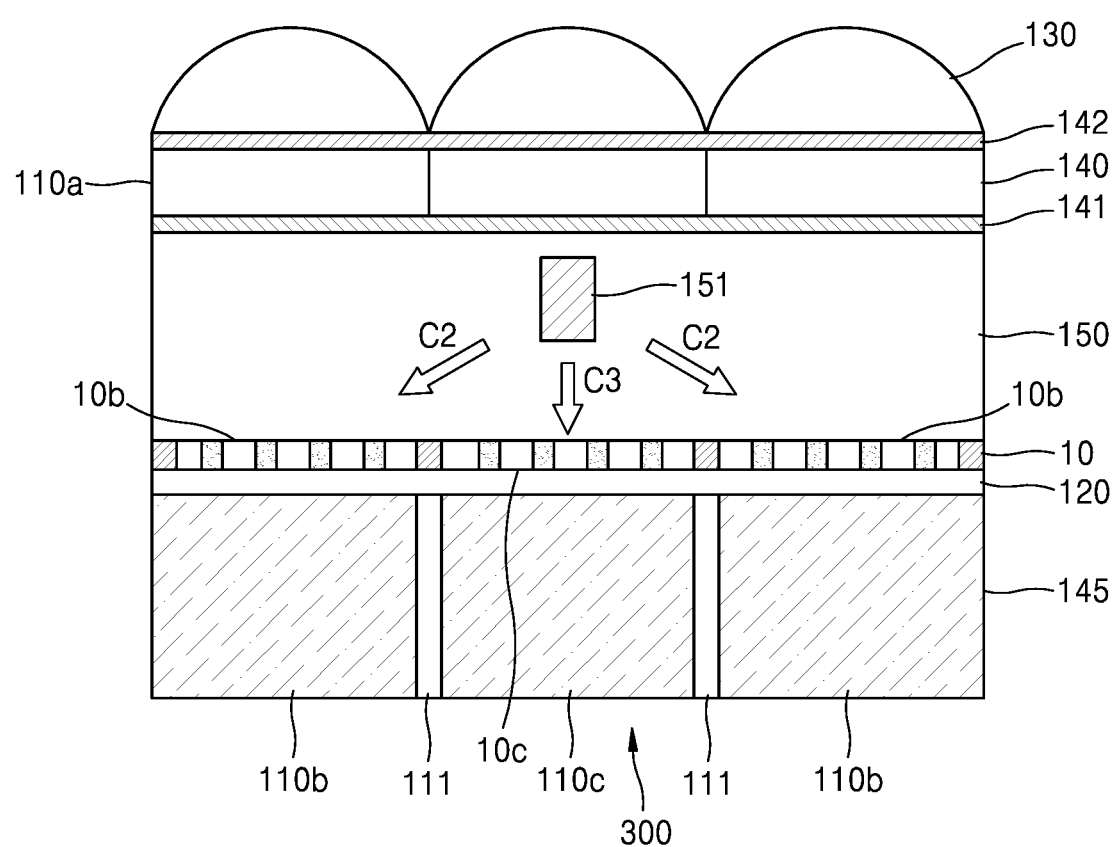
FIG. 14 is a cross-sectional view schematically illustrating an image sensor according to yet another exemplary embodiment which includes the color filter array according to the above exemplary embodiments.

FIG. 14 is a cross-sectional view schematically illustrating an image sensor 300 according to another exemplary embodiment that employs the color filter array 10 discussed above. Referring to FIG. 14, an image sensor 300 may include a first light sensing layer 140 including a plurality of first pixels 110A absorbing and detecting light of a first wavelength range and transmitting light of other wavelength ranges, a second light sensing layer 145 including a plurality of second pixels 110B detecting light of a second wavelength range and a plurality of third pixels 110C detecting light of a third wavelength range, a transparent spacer layer 150 disposed between the first light sensing layer 140 and the second light sensing layer 145, a color separation element 151 disposed in the transparent spacer layer 150, and a color filter array 10 disposed between the transparent spacer layer 150 and the second light sensing layer 145. Also, the image sensor 300 may further include an antireflection layer 120 disposed between the second light sensing layer 145 and the color filter array 10 to prevent the reflection of the light incident from the color filter array 10 onto the second light sensing layer 145.

As discussed above with reference to FIG. 13, light of a first wavelength range incident on the image sensor 300 is absorbed by the first light sensing layer 140, and only light of the second and third wavelength ranges may be transmitted through the first light sensing layer 140. In the image sensor 300 of FIG. 14, light of the second and third wavelength ranges that is transmitted through the first light sensing layer 140 may be incident on the transparent spacer layer 150 and separated by the color separation element 151. The color separation element 151 is disposed at a light entrance side of the second light sensing layer 145 to separate incident light according to wavelength so that light of different wavelengths may enter pixels corresponding to the respectively wavelengths. The color separation element 151 may separate colors of incident light by changing the propagation direction of light according to wavelength by using diffraction or refraction properties of light that vary according to wavelength. For this operation, the color separation element 151 may be formed of a material having a refractive index greater than that of the spacer layer 150 surrounding the color separation element 151. For example, the spacer layer 150 may be formed of silicon dioxide (SiO2) or siloxane-based spin-on-glass (SOG), and the color separation element 151 may be formed of a material having a high refractive index such as titanium dioxide (TiO$_2$), silicon nitrides (SiN$_x$, Si$_3$N$_4$), zinc sulfide (ZnS), and zinc selenide (ZnSe). Various structures such as a transparent symmetric or asymmetric bar structure and a prism structure having a slanted surface are known in the art as structures suitable for the color separation element. Thus, the structure of the color separation element 151 may be designed in any of various manners according to the desired spectrum of exiting light.

As shown in FIG. 14, the color separation element 151 may be configured to separate the light incident thereon into light C2 of a second wavelength range and light C3 of a third wavelength range, so that light C2 of the second wavelength range propagates to the second pixel 110B in the second light sensing layer 145 and light C3 of the third wavelength range propagates to the third pixel 110C. For example, the color separation element 151 may be designed to change the propagation direction of light C2 of the second wavelength range into oblique directions facing laterally downwards while not changing the propagation direction of light C3 of the third wavelength range. Then, light C3 of the third wavelength range may be incident on the third pixel 110C located directly under the color separation element 151, and light C2 of the second wavelength range may be incident on the second pixels 110B located at lateral sides of the color separation element 151. As a result, the second pixels 110B located at lateral sides of the color separation element 151 may detect light C2 of the second wavelength range, and the third pixels 110C located under the color separation element 151 may detect light C3 of the third wavelength band.

In the exemplary embodiment shown in FIG. 14, light C2 of the second wavelength range separated by the color separation element 151 is incident on the second color filters 10B and may be transmitted through the second color filters 10B with little loss. Similarly, light C3 of the third wavelength range separated by the color separation element 151 is incident on the third color filter 10C and may be transmitted through the third color filter 10C with little loss. Meanwhile, the first light sensing layer 140 may absorb almost all light of a first wavelength range. Therefore, light of the first through third wavelength ranges may be used efficiently. As a consequence, the sensitivity of the image sensor 300 may be enhanced in all wavelength ranges. Further, since the color separation element 151 may be configured to separate light of only two wavelength ranges, the color separation element 151 may be easily designed and manufactured.

Figure 15:
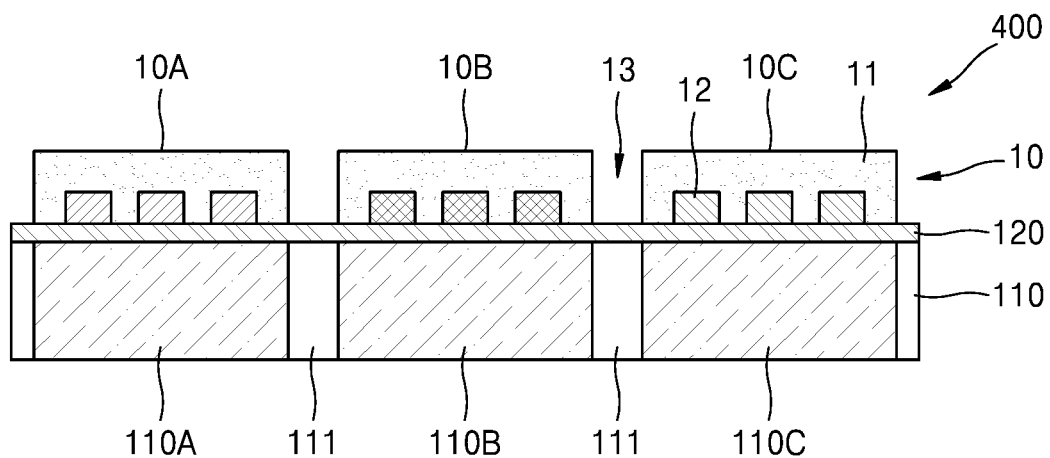
FIG. 15 is a cross-sectional view schematically illustrating an image sensor according to yet another exemplary embodiment which includes the color filter array according to the above exemplary embodiments.

FIG. 15 is a cross-sectional view schematically illustrating an image sensor 400 according to yet another exemplary embodiment that employs the color filter array 10 discussed above. Referring to FIG. 15, the image sensor 400 may include a light sensing layer 110 having a plurality of pixels 110A, 110B, and 110C separated by a trench 111, an antireflection layer 120 disposed on the light sensing layer 110, and the color filter array 10. The color filter array 10 may include a plurality of color filters 10A, 10B, and 10C and an isolation wall 13 arranged between the color filters 10A and 10B, and between the color filters 10B and 10C. The isolation wall 13 may be air. Each of the color filters 10A, 10B, and 10C may include a plurality of Mie resonance particles 12 and a transparent dielectric 11 surrounding the plurality of Mie resonance particles 12. The transparent dielectric 11 may completely covers upper surfaces of the plurality of Mie resonance particles 12.

Figure 16:
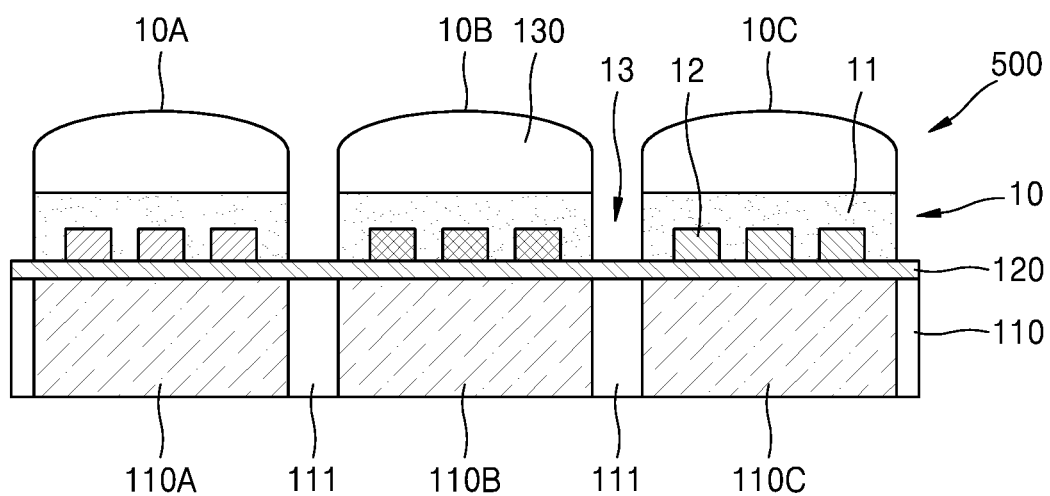
FIG. 16 is a cross-sectional view schematically illustrating an image sensor according to yet another exemplary embodiment which includes the color filter array according to the above exemplary embodiments.

FIG. 16 is a cross-sectional view schematically illustrating an image sensor 500 according to yet another exemplary embodiment that employs the color filter array 10 discussed above. Referring to FIG. 16, the image sensor 500 has the same structure as the image sensor 400, except that each of the color filters 10A, 10B, and 10C further includes a microlens 130 disposed on the transparent dielectric 11.

Figure 17:
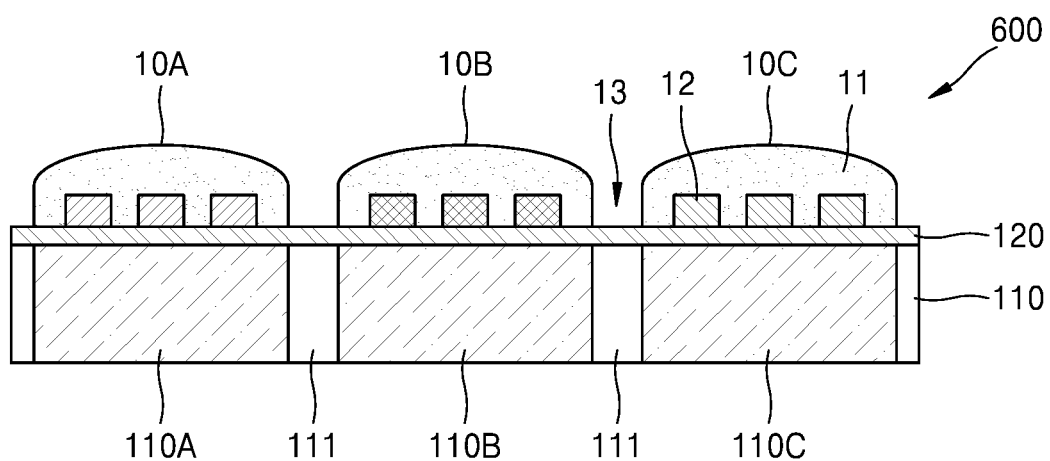
FIG. 17 is a cross-sectional view schematically illustrating an image sensor according to yet another exemplary embodiment which includes the color filter array according to the above exemplary embodiments.

FIG. 17 is a cross-sectional view schematically illustrating an image sensor 600 according to yet another exemplary embodiment that employs the color filter array 10 discussed above. Referring to FIG. 17, the image sensor 600 has the same structure as the image sensor 400, except that an upper surface of the transparent dielectric 11 is convexly curved such that the transparent dielectric 11 acts as a microlens.

Figure 18:
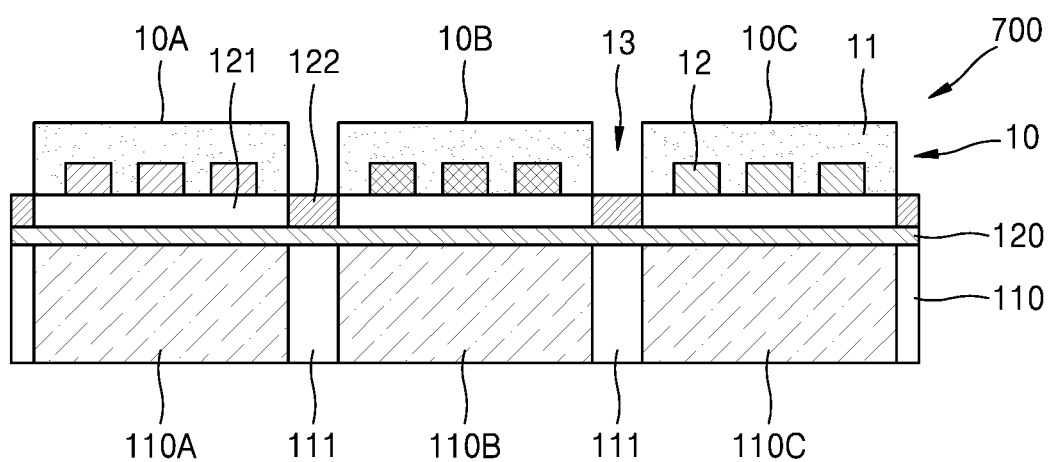
FIG. 18 is a cross-sectional view schematically illustrating an image sensor according to yet another exemplary embodiment which includes the color filter array according to the above exemplary embodiments.

FIG. 18 is a cross-sectional view schematically illustrating an image sensor 700 according to yet another exemplary embodiment that employs the color filter array 10 discussed above. Referring to FIG. 18, the image sensor 700 may include a light sensing layer 110 having a plurality of pixels 110A, 110B, and 110C separated by a trench 111, an antireflection layer 120 disposed on the light sensing layer 110, the color filter array 10 having a plurality of color filters 10A, 10B, and 10C and an isolation wall 13 arranged between the color filters 10A and 10B and between the color filters 10B and 10C, and a plurality of planarization layers 121. Each of the plurality of planarization layers 121 disposed between the antireflection layer 120 and each of the plurality of color filters 10A, 10B, and 10C. the image sensor 700 may further include a plurality of metal grids 122. Each of the plurality of metal grids 122 may be disposed between two adjacent planarization layers 121. The isolation wall 13 may be disposed on each of the metal grids 122.

Figure 19:
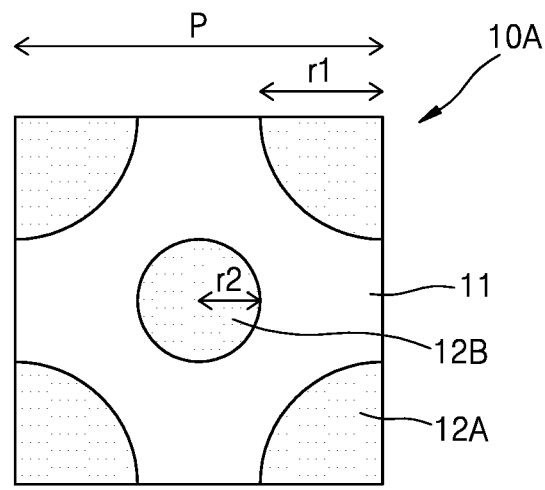
FIG. 19 is a plan view schematically illustrating a color filter according to another exemplary embodiment.

FIG. 19 is a plan view schematically illustrating a color filter 10A according to another exemplary embodiment. Referring to FIG. 19, the color filter 10A may include four first Mie resonance particles 12A. Each of the first Mie resonance particles 12A may have a quarter circular shape and be disposed at a corner of the color filter 10A. The color filter 10A may further include a second Mie resonance particle 12B having a circular shape. The second Mie resonance particle 12B may be disposed at center portion of the color filter 10A. The heights of the first and second Mie resonance particles 12A and 12B may range from about 200 nm to about 300 nm and diameters d of the first and second Mie resonance particles 12A and 12B may range from about 60 nm to about 180 nm.

FIGS. 20A through 20E are graphs illustrating exemplary transmittance spectra for each color filter according to diameters of the first and second Mie resonance particles 12A and 12B. In the color filters of FIGS. 20A through 20E, the first and second Mie resonance particles 12A and 12B formed of polysilicon were used, and a diameter d1 of the first Mie resonance particles 12A and a diameter d2 of the second Mie resonance particle 12B were differentiated among the color filters corresponding to FIGS. 20A through 20E, respectively. For comparison, the transmittance characteristics of related art organic color filters are shown together by dashed line graphs.

Figure 20A:
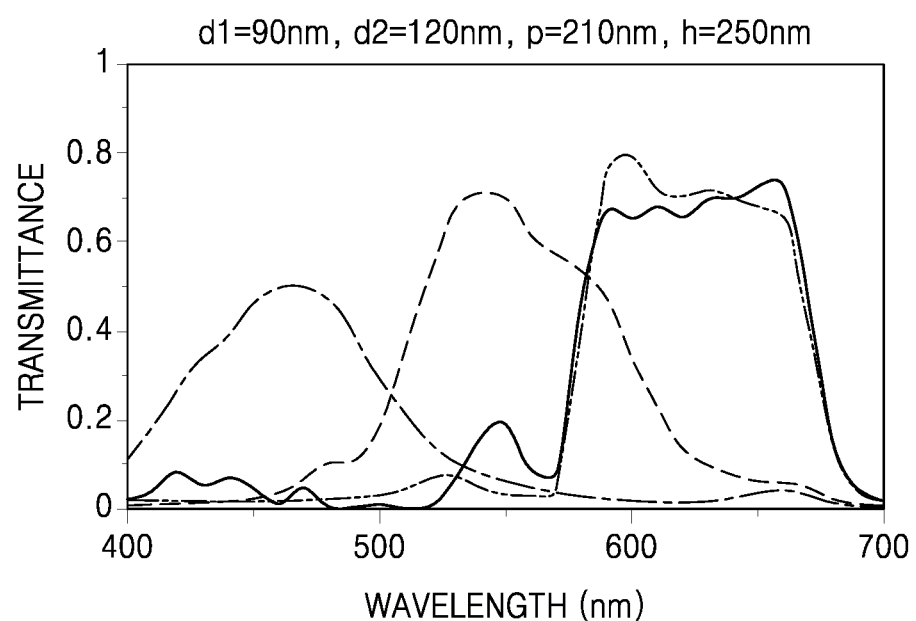
FIGS. 20A through 20E are graphs illustrating exemplary transmittance spectra of each color filter according to diameters of Mie resonance particles.
Figure 20B:
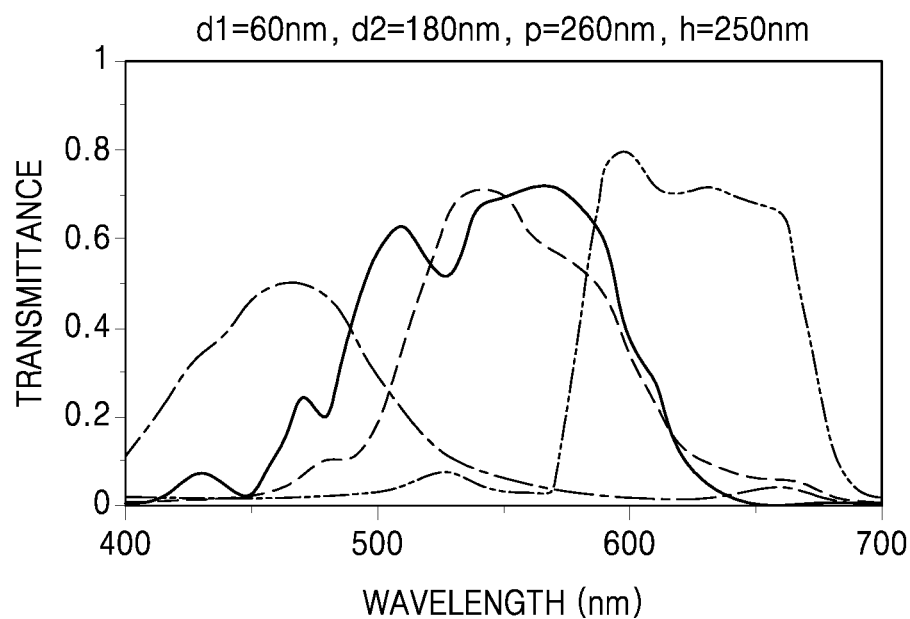
Figure 20C:
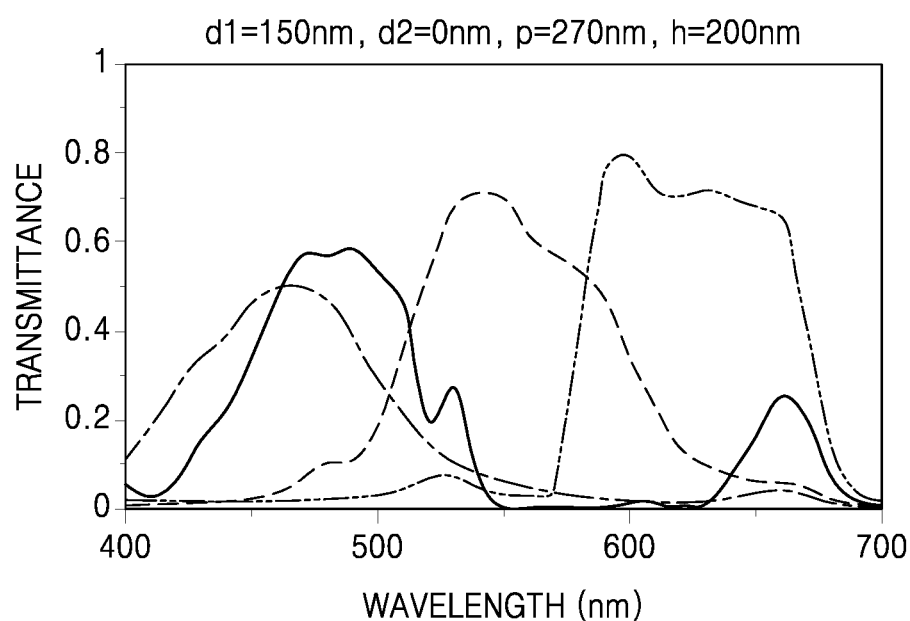
Figure 20D:
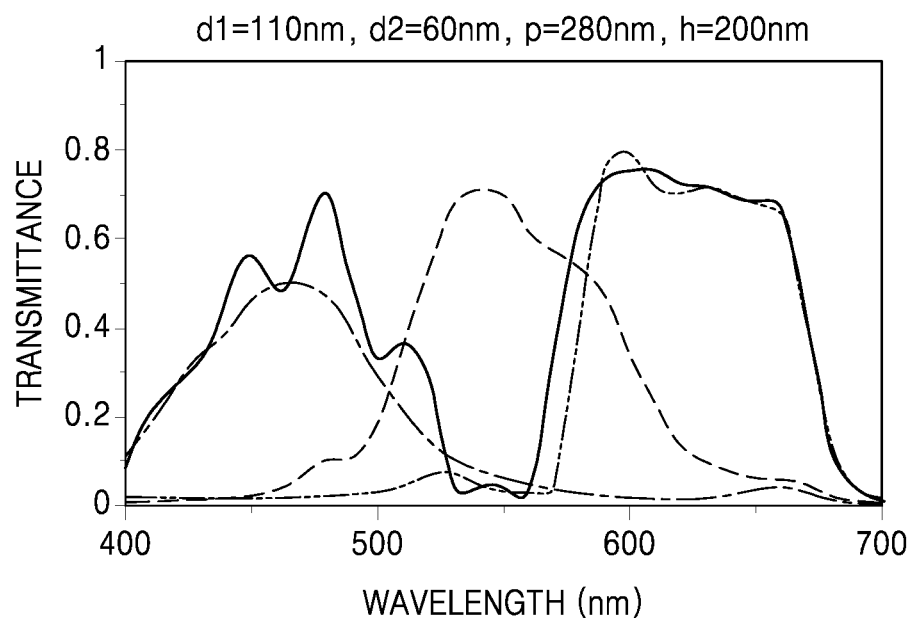
Figure 20E:
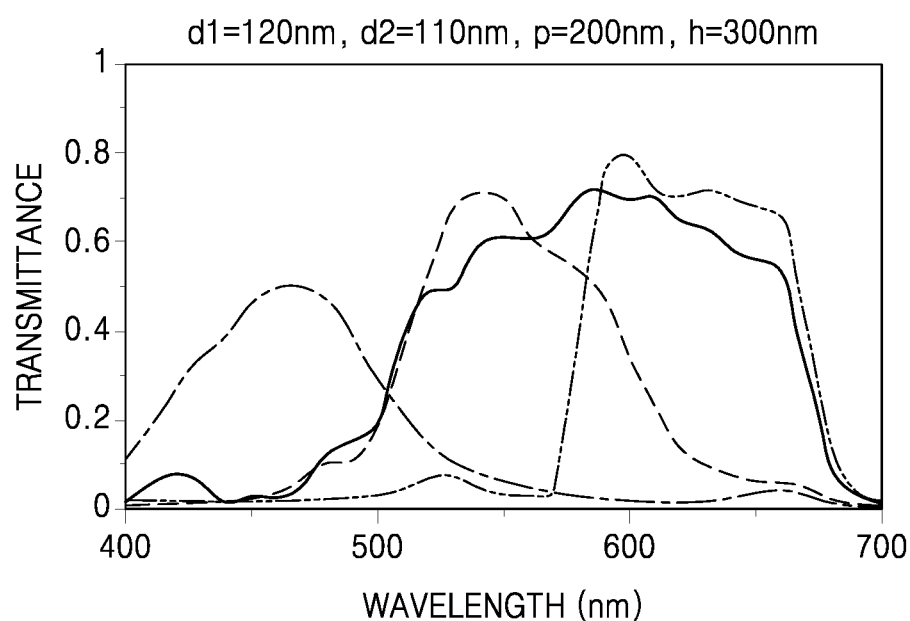

As shown by a solid line graph in FIG. 20A, the color filter transmits most of the red light when d1=90 nm, d2=120 nm, p=210 nm, and h=250 nm, where p is a pitch between adjacent two color filters and h is a height of the first and second Mie resonance particles 12A and 12B. As shown by a solid line graph in FIG. 20B, the color filter transmits most of the green light when d1=60 nm, d2=180 nm, p=260 nm, and h=250 nm. As shown by a solid line graph in FIG. 20C, the color filter transmits most of the blue light when d1=150 nm, d2=0 nm, p=270 nm, and h=200 nm. As shown by a solid line graph in FIG. 20D, the color filter transmits most of the magenta light when d1=110 nm, d2=60 nm, p=280 nm, and h=200 nm. As shown by a solid line graph in FIG. 20E, the color filter transmits most of the yellow light when d1=120 nm, d2=110 nm, p=200 nm, and h=300 nm.

Figure 21:
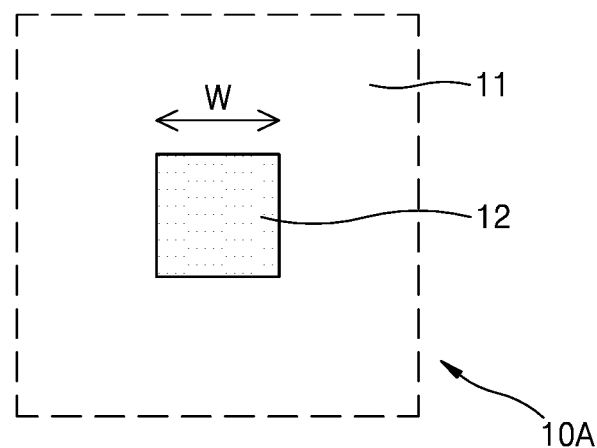
FIG. 21 is a plan view schematically illustrating a color filter according to yet another exemplary embodiment.

FIG. 21 is a plan view schematically illustrating a color filter 10A according to yet another exemplary embodiment. Referring to FIG. 21, the color filter 10A may include a Mie resonance particle 12 having a square shape. The Mie resonance particle 12 may be disposed at center portion of the color filter 10A. A width W of the Mie resonance particle 12 may range from about 100 nm to about 200 nm.

FIGS. 22A through 22E are graphs illustrating exemplary transmittance spectra for each color filter according to a width of a Mie resonance particle 12. In the color filters of FIGS. 22A through 22E, the Mie resonance particle 12 formed of polysilicon was used, and a width w was differentiated among the color filters corresponding to FIGS. 22A through 22E, respectively. For comparison, the transmittance characteristics of related art organic color filters are shown together by dashed line graphs.

Figure 22A:
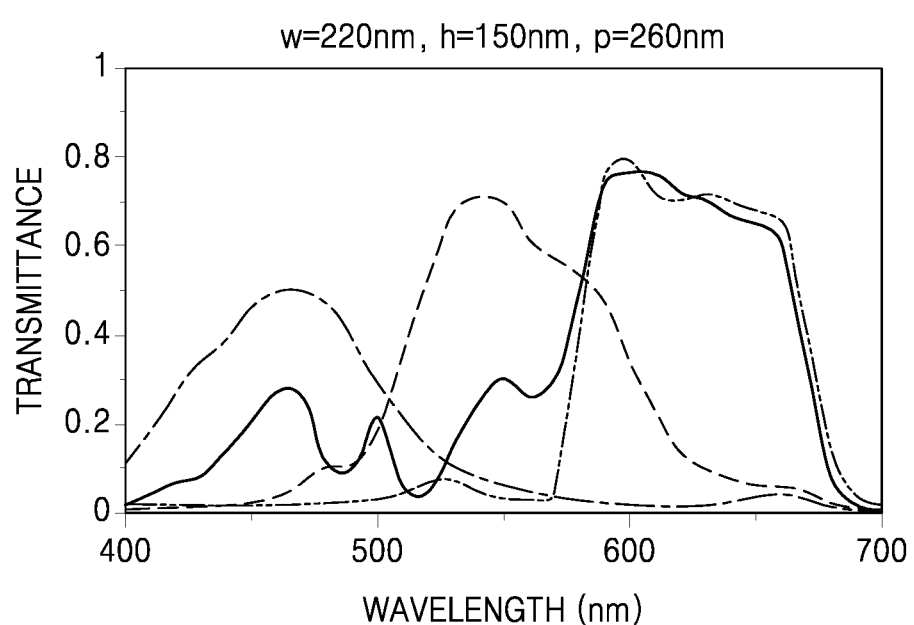
FIGS. 22A through 22E are graphs illustrating exemplary transmittance spectra of each color filter according to a width of a Mie resonance particle.
Figure 22B:
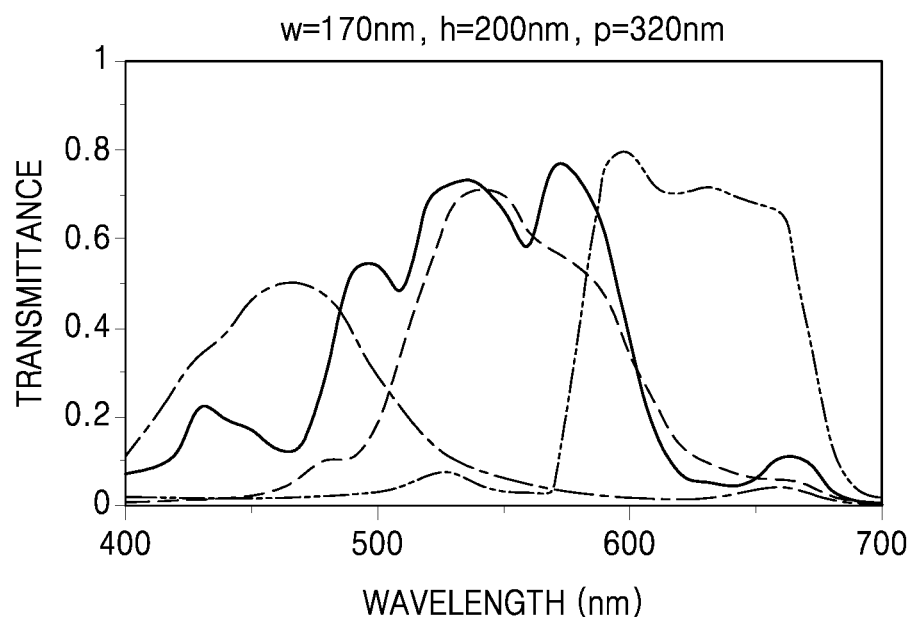
Figure 22C:
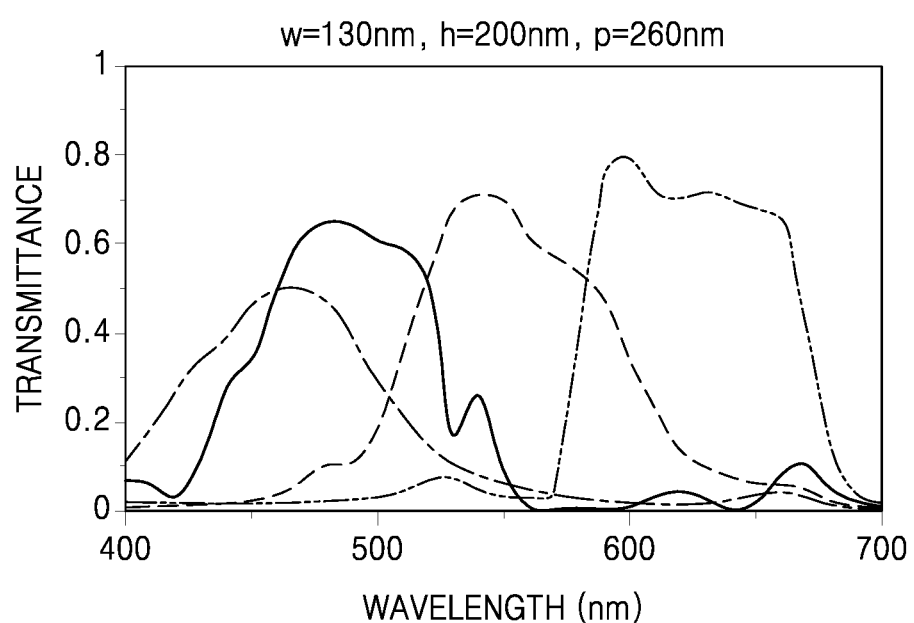
Figure 22D:
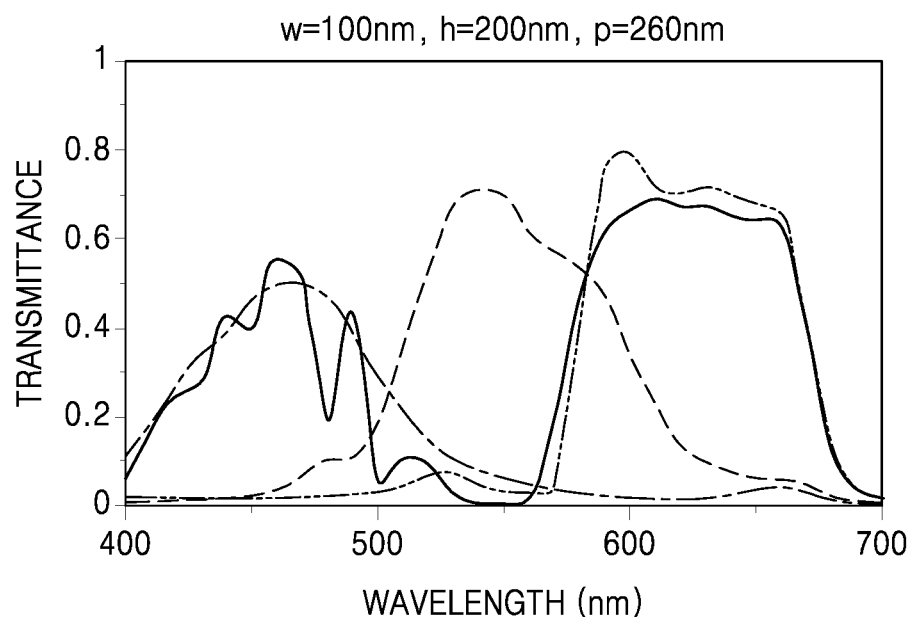
Figure 22E:
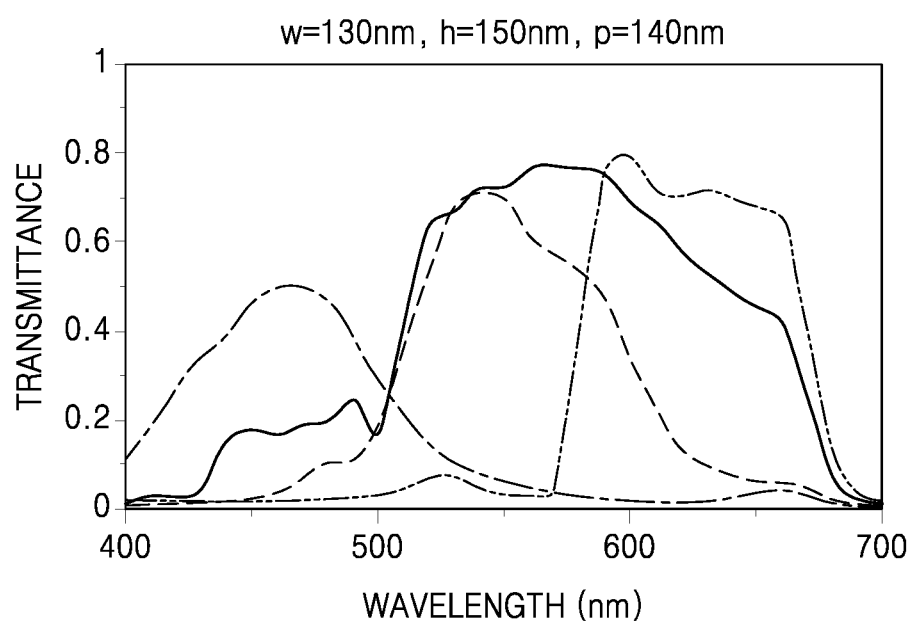

As shown by a solid line graph in FIG. 22A, the color filter transmits most of the red light when w=220 nm, h=150 nm, and p=260 nm, where h is a height of the Mie resonance particle 12 and p is a pitch between adjacent two color filters. As shown by a solid line graph in FIG. 22B, the color filter transmits most of the green light when w=170 nm, h=200 nm, and p=320 nm. As shown by a solid line graph in FIG. 22C, the color filter transmits most of the blue light when w=130 nm, h=200 nm, and p=260 nm. As shown by a solid line graph in FIG. 22D, the color filter transmits most of the magenta light when w=100 nm, h=200 nm, and p=260 nm. As shown by a solid line graph in FIG. 22E, the color filter transmits most of the yellow light when w=130 nm, h=150 nm, and p=140 nm.

Various exemplary embodiments of color filter arrays including an inorganic color filter, and image sensors and display devices employing a color filter array have been described above with reference to the accompanying drawings. However, it should be understood that the exemplary embodiments described herein are to be considered in a descriptive sense only and not for purposes of limitation. Descriptions of features or aspects within each exemplary embodiment should typically be considered as available for other similar features or aspects in other exemplary embodiments.

While one or more exemplary embodiments of the present disclosure have been described with reference to the figures, it will be understood by those of ordinary skill in the art that various changes in form and details may be made therein without departing from the spirit and scope of the present disclosure as defined by the following claims.

What is claimed is:
1. An image sensor comprising:
a light sensing layer comprising an array of a plurality of pixels arranged two-dimensionally, the plurality of pixels comprising a first pixel configured to detect light of a first wavelength range and a second pixel configured to detect light of a second wavelength range, different from the first wavelength range;
a color filter array disposed on the light sensing layer, the color filter array comprising a plurality of color filters arranged two-dimensionally, the plurality of color filters comprising a first color filter facing the first pixel and configured to transmit the light of the first wavelength range and a second color filter facing the second pixel and configured to transmit the light of the second wavelength range;
a transparent spacer layer disposed on the color filter array; and
a plurality of color separation elements disposed in the transparent spacer layer, the plurality of color separation elements configured to direct the light of the first wavelength range toward the first pixel and to direct the light of the second wavelength range toward the second pixel,
wherein each of the first color filter and the second color filter comprises at least one particle configured to scatter light incident thereon and a transparent dielectric surrounding the at least one particle,
wherein the color filter array comprises an isolation wall arranged between the first color filter and the second color filter and configured to prevent interactions between particles of the first color filter and particles of the second color filter.

2. The image sensor of claim 1, wherein a refractive index of the at least one particle is greater than a refractive index of the transparent dielectric.

3. The image sensor of claim 2, wherein the at least one particle has a refractive index greater than 3.5 with respect to visible light.

4. The image sensor of claim 1, wherein the at least one particle is formed of at least one material selected from a group consisting of germanium (Ge), amorphous silicon (a-Si), polycrystalline silicon (p-Si), crystalline silicon (c-Si), III-V compound semiconductor, titanium dioxide ($TiO_2$), and silicon nitride ($SiN_x$).

5. The image sensor of claim 1, wherein the isolation wall is formed of a first material, and the transparent dielectric is formed of a second material, different from the first material.

6. The image sensor of claim 5, wherein the isolation wall is formed of at least one material selected from a group consisting of tungsten (W), aluminum (Al), gold (Au), silver (Ag), titanium (Ti), nickel (Ni), platinum (Pt), an alloy thereof, titanium nitride (TiN), and air.

7. The image sensor of claim 1, wherein a thickness of each of the plurality of color filters is in a range from about 200 nm to about 300 nm.

8. The image sensor of claim 1, wherein an aspect ratio of each of the at least one particle is in a range of about 0.5 to about 6.

9. The image sensor of claim 1, wherein the first color filter transmits the light of the first wavelength range due to a shape, a size, and a thickness of each of the at least one particle of the first color filter and a distance between the particles of the first color filter, and
wherein the second color filter transmits the light of the second wavelength range due to a shape, a size, and a thickness of each of the at least one particle of the second color filter and a distance between the particles of the second color filter.

10. The image sensor of claim 1, wherein each of the plurality of color filters comprises a plurality of unit cells arranged periodically therein, each of the plurality of unit cells comprising a plurality of particles arranged irregularly therein.

11. The image sensor of claim 1, wherein the isolation wall comprises a plurality of isolation members arranged along boundaries of each of the plurality of color filters, and
wherein the plurality of isolation members are spaced apart from each other.

12. The image sensor of claim 1, wherein each of the plurality of color filters comprises four first particles, each of the first particles having a quarter circular shape and being disposed at a corner of each of the plurality of color filters.

13. The image sensor of claim 12, wherein each of the plurality of color filters further comprises a second particle, the second particle having a circular shape and being disposed at center portion of each of the plurality of color filters.

14. The image sensor of claim 1, wherein each of the plurality of color filters comprises a square shaped particle, the square shaped particle being disposed at center portion of each of the plurality of color filters.

15. The image sensor of claim 1, wherein the color separation element is formed of a material having a refractive index greater than that of the transparent spacer layer.

16. The image sensor of claim 1, further comprising:
an additional light sensing layer disposed on the transparent spacer layer, the additional light sensing layer comprising a third pixel configured to absorb and detect light of a third wavelength range, different from the first wavelength range and the second wavelength range, and to transmit the light of the first wavelength range and the light of the second wavelength range.

17. The image sensor of claim 16, further comprising:
a plurality of driving signal lines extending from the light sensing layer to the additional light sensing layer, the plurality of driving signal lines configured to transmit driving signals to the additional light sensing layer or to receive data signals from the additional light sensing layer.

18. The image sensor of claim 17, wherein the isolation wall comprises a conductive metallic material and the plurality of driving signal lines extend to the additional light sensing layer through the isolation wall.

19. The image sensor of claim 16, further comprising:
a first transparent electrode disposed on a lower surface of the additional light sensing layer; and
a second transparent electrode disposed on an upper surface of the additional light sensing layer.

* * * * *